(12) United States Patent
Lee et al.

(10) Patent No.: US 7,045,450 B2
(45) Date of Patent: May 16, 2006

(54) METHOD OF MANUFACTURING SEMICONDUCTOR DEVICE

(75) Inventors: Sang Ick Lee, Kyoungki-do (KR); Jong Han Shin, Seoul (KR); Hyung Soon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 165 days.

(21) Appl. No.: 10/875,052

(22) Filed: Jun. 22, 2004

(65) Prior Publication Data

US 2005/0095834 A1     May 5, 2005

(30) Foreign Application Priority Data

Oct. 31, 2003  (KR) .................... 10-2003-0076583

(51) Int. Cl.
*H01L 21/44* (2006.01)

(52) U.S. Cl. .............. 438/597; 438/692; 438/694; 438/695; 438/696; 438/697; 438/700; 438/593; 438/675; 438/674; 438/637

(58) Field of Classification Search .............. 438/597, 438/692, 696, 697, 700, 693, 675, 674, 694, 438/695, 637
See application file for complete search history.

(56) References Cited

U.S. PATENT DOCUMENTS

| | | | | |
|---|---|---|---|---|
| 5,928,959 A | * | 7/1999 | Huckels et al. | 438/691 |
| 6,100,137 A | * | 8/2000 | Chen et al. | 438/253 |
| 6,200,898 B1 | * | 3/2001 | Tu | 438/692 |
| 6,383,863 B1 | * | 5/2002 | Chiang et al. | 438/241 |
| 6,531,353 B1 | * | 3/2003 | Lee | 438/210 |
| 2001/0049185 A1 | * | 12/2001 | Hosotani et al. | 438/586 |
| 2003/0116808 A1 | * | 6/2003 | Oguchi | 257/382 |

* cited by examiner

*Primary Examiner*—B. William Baumeister
*Assistant Examiner*—Victor V. Yevsikov
(74) *Attorney, Agent, or Firm*—Ladas & Parry LLP

(57) ABSTRACT

Disclosed is a method of manufacturing a semiconductor device. The method includes the steps of forming gates on a substrate, forming junction areas on a surface of the substrate, forming a first BPSG layer on a resultant structure of the substrate, performing a first CVD process for the first BPSG layer, forming a second BPSG layer on the first BPSG layer, forming a landing plug contact, depositing a polysilicon layer on a resultant structure of the substrate, and performing a second CMP process for the polysilicon layer, the second BPSG layer and the nitride hard mask. The CMP processes are carried by using acid slurry having a high polishing selectivity with respect to the nitride layer, so a step difference between the cell region and the peripheral region is removed, thereby simplifying the semiconductor manufacturing process and removing a dishing phenomenon.

9 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device capable of preventing process failure caused by a step difference between a cell region and a peripheral region and preventing yield loss derived from such process failure.

2. Description of the Prior Art

As semiconductor devices have come highly integrated, there is difficulty in making a contact between upper and lower patterns, that is, it is difficult to form a contact between a junction area and a bit line and between a junction area and a capacitor.

To solve the above problems, a landing plug poly is currently adopted in most of semiconductor manufacturing processes in order to form a stable electric contact between upper and lower patterns. Electric connection between the junction area and the bit line and between the junction area and the capacitor is stably achieved trough such a landing plug poly.

According to a conventional semiconductor manufacturing process, after a gate has been formed, a BPSG layer is deposited on the gate as an insulating interlayer. Then, an annealing process is carried out with respect to the BPSG layer such that the BPSG layer is melted and flows into a gap, thereby completely filling the gap.

However, such a conventional semiconductor manufacturing process may necessarily cause a step difference between a cell region and a peripheral region, so it is necessary to recess the cell region by performing a cell-open mask forming process and an etching process by using a cell-open mask in order to ensure reliability of the following processes. Therefore, the conventional semiconductor manufacturing process not only causes some trouble in the manufacture of semiconductor devices, but also increases manufacturing costs.

In addition, in order to form the landing plug poly, the conventional semiconductor manufacturing process carries out a CMP (chemical mechanical polishing) process by using alkalic slurry after depositing a polysilicon layer. If the CMP process is carried out by using such alkalic slurry, a dishing phenomenon may occur in surfaces of a BPSG layer including insulating interlayer material, and the polysilicon layer including plug material.

For this reason, an oxide layer must be additionally deposited in order to solve the above dishing problem, thereby causing some trouble in the manufacture of semiconductor devices.

In particular, polishing residual may exist in a dishing region without being completely removed through a following cleaning process. In this case, a bridge is created between bit line contacts or storage node contacts, thereby causing yield loss.

SUMMARY OF THE INVENTION

Accordingly, the present invention has been made to solve the above-mentioned problems occurring in the prior art, and an object of the present invention is to provide a method of manufacturing a semiconductor device capable of preventing process troubles in the manufacture of semiconductor devices.

Another object of the present invention is to provide a method of manufacturing a semiconductor device capable of solving a dishing problem, thereby preventing yield loss of semiconductor devices derived from the dishing problem.

In order to accomplish the object, there is provided a method of manufacturing a semiconductor device, the method comprising the steps of forming gates having nitride hard mask on an upper surface of a semiconductor substrate; forming junction areas on a surface of the semiconductor substrate between gates; forming a first BPSG layer on a resultant structure of the semiconductor substrate such that the gates are covered with the first BPSG layer; performing a first chemical mechanical polishing process with respect to the first BPSG layer by using acid slurry having a high polishing selectivity between an oxide layer and a nitride layer in such a manner that the nitride hard mask of each gate is exposed; forming a second BPSG layer on the first BPSG layer, which is polished through the chemical mechanical polishing process; forming a landing plug contact, which simultaneously exposes surfaces of the junction areas formed between gates, by etching the second and first BPSG layers; depositing a polysilicon layer on a resultant structure of the semiconductor substrate such that the landing plug contact is filled up with the polysilicon layer; and performing a second chemical mechanical polishing process with respect to the polysilicon layer, the second BPSG layer and the nitride hard mask by using acid slurry in such a manner that landing plug polys make contact with gates while being spaced from the junction areas formed between the gates.

According to the preferred embodiment of the present invention, the step of forming the first BPSG layer includes the substeps of depositing a BPSG layer including 10 to 25 volume percent of boron and 5 to 12 volume percent of phosphorous with a thickness of about 3000 to 6000 Å, and annealing a resultant structure of the semiconductor substrate for 10 to 30 minutes in a steam atmosphere having a temperature of about 700 to 900° C. such that a gap-fill characteristic is maximized. After the annealing step has been carried out, a cleaning process is carried out by using sulfuric acid and hydrogen peroxide.

Acid slurry used in the first chemical mechanical polishing process for the first BPSG layer includes colloidal silica abrasive and has pH of about 2–7. 0.1 to 3 wt % of polycyclic acid-based material, such as polyacrylic acid or polyethylene glycol, is added to acid slurry in order to improve a polishing selectivity with respect to the nitride layer.

The step of forming the second BPSG layer includes the substeps of depositing a BPSG layer including 2 to 10 volume percent of boron and 1 to 5 volume percent of phosphorous with a thickness of about 500 to 3000 Å, and annealing a resultant structure of the semiconductor substrate for 10 to 30 minutes in a steam atmosphere having a temperature below 750° C. such that a diffusion effect of boron ions is minimized against the resultant structure of the semiconductor substrate while significantly reducing a thermal budget as much as possible.

Acid slurry used in the second chemical mechanical polishing process for the polysilicon layer, second BPSG layer and nitride hard mask includes colloidal silica abrasive and has pH of about 2–7.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
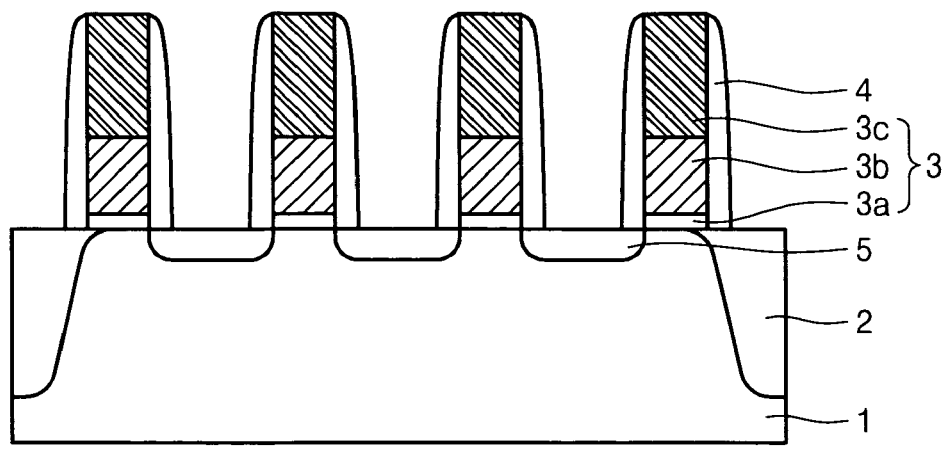
FIGS. 1a to 1g are sectional views for explaining a method of manufacturing a semiconductor device according to one embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 1a to 1g are sectional views for explaining a method of manufacturing a semiconductor device according to one embodiment of the present invention.

Referring to FIG. 1a, a semiconductor substrate 1 having trench-type isolation layers 12 formed through an STI (shallow trench isolation) process for defining an active area is prepared. Then, a gate oxide layer 3a, a gate conductive layer 3b in the form of a stacked layer of polysilicon and tungsten or tungsten silicide, and a nitride hard mask 3c are sequentially formed on the semiconductor substrate 1. After that, the nitride hard mask 3c, the gate conductive layer 3b, and the gate oxide layer 3a are etched, thereby forming gates 3 having the nitride hard mask 3c at an upper portion thereof.

Then, after forming a spacer 4 at both sidewalls of each gate 3, a source/drain ion implantation process is carried out with respect to an entire surface of the semiconductor substrate, thereby forming a junction area between gates 4 formed on a surface of the semiconductor substrate 1.

Figure 1B:
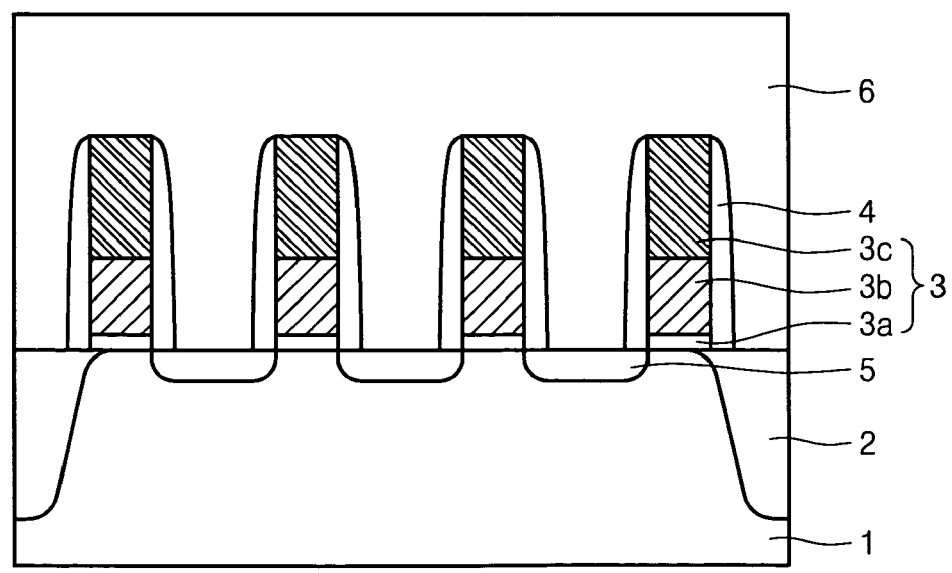

Referring to FIG. 1b, a first BPSG layer 6 is formed on a resultant structure of the substrate with a thick thickness such that the gates 3 are covered with the first BPSG layer 6. At this time, the first BPSG layer 6 includes 10 to 25 volume percent of boron B and 5 to 12 volume percent of phosphorous and is deposited with a thickness of about 3000 to 6000 Å. Then, the resultant structure of the substrate is subject to an annealing process for 10 to 30 minutes in a steam atmosphere having a temperature of about 700 to 900° C. such that the first BPSG layer 6a is melted and flows into a gap, thereby maximizing a gap-fill characteristic. After that, a cleaning process is carried out by means of sulfuric acid and hydrogen peroxide.

Figure 1C:
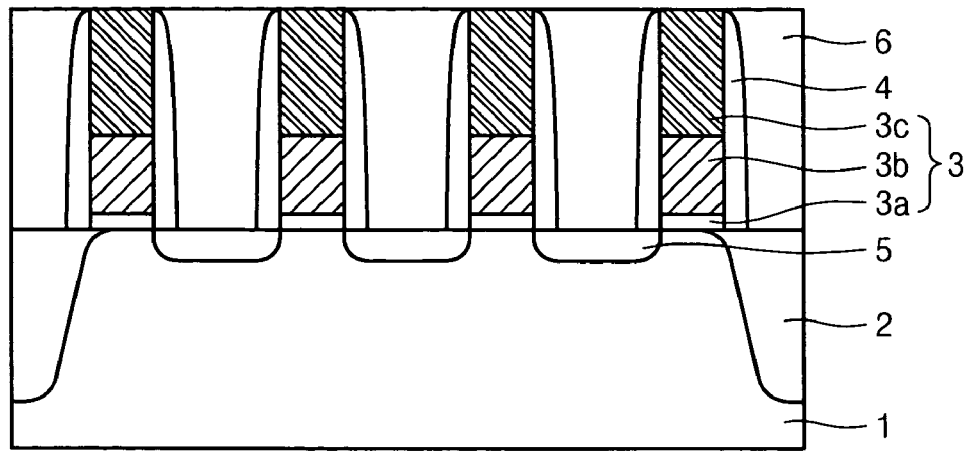

Referring to FIG. 1c, a CMP process is carried out with respect to the first BPSG layer 6 such that the nitride hard mask 3c of each gate 3 is exposed. At this time, such a CMP process for the BPSG layer 6 may be performed by using modified slurry, preferably, acid slurry having a high polishing selectivity between an oxide layer and a nitride layer in order to minimize a dishing phenomenon created in a surface of the BPSG layer 6. Such acid slurry includes colloidal silica abrasive and has pH of about 2–7. In addition, 0.1 to 3 wt % of polycyclic acid-based material, such as polyacrylic acid or polyethylene glycol, is added to acid slurry in order to minimize loss of the nitride hard mask 3c during the CMP process.

Herein, although it is not illustrated in detail, since such CMP process is carried out by using the nitride hard mask of the gate as a polishing stop layer, a step difference is not formed between the cell region and the peripheral region, so the cell-open mask forming process and the etching process, which are required for selectively recessing the cell region, can be omitted. Therefore, the semiconductor manufacturing process can be simplified while reducing a manufacturing cost thereof.

Figure 1D:
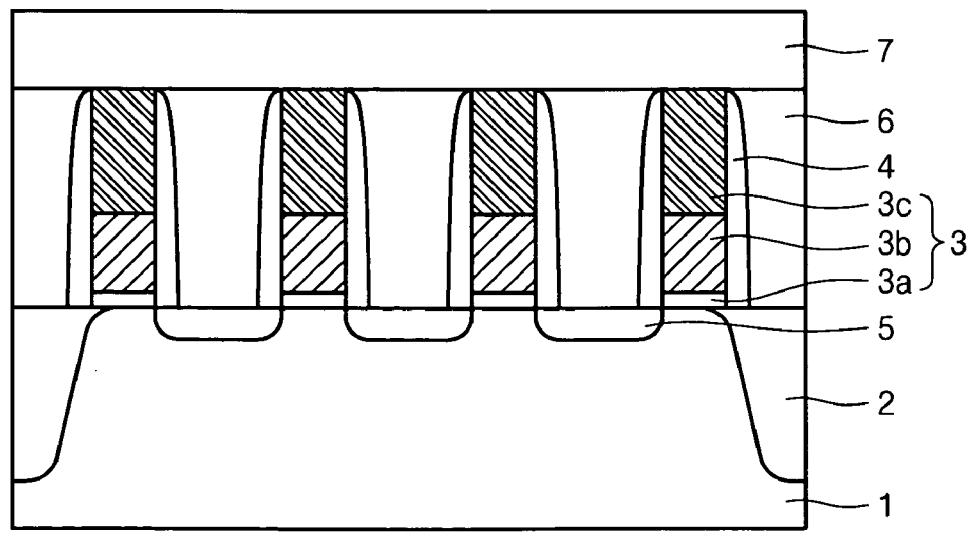

Referring to FIG. 1d, a second BPSG layer 7 is deposited on the first BPSG layer 6, which has been polished through the CMP process, and the gates 3. At this time, the second BPSG layer 7 includes 2 to 10 volume percent of boron B and 1 to 5 volume percent of phosphorous and is deposited with a thickness of about 500 to 3000 Å such that a next landing plug contact forming process is advantageously carried out. Then, the resultant structure of the substrate is subject to an annealing process for 10 to 30 minutes in a steam atmosphere having a temperature below 750° C. in such a manner that a thermal budget is significantly reduced as much as possible while minimizing the diffusion effect of boron ions against the resultant structure of the semiconductor substrate.

Figure 1E:
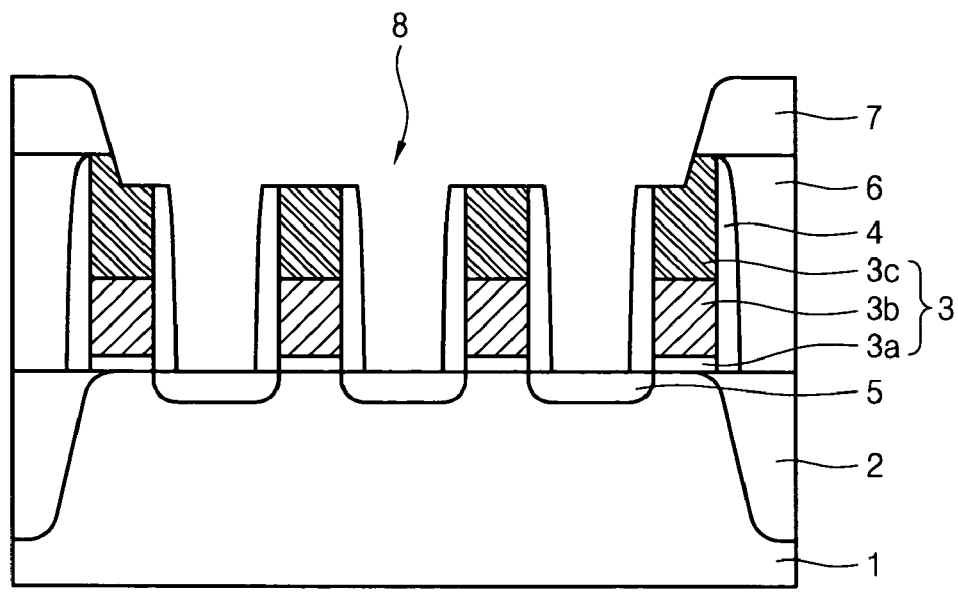

Referring to FIG. 1e, the second and first BPSG layers 7 and 6 are sequentially etched through an SAC process, thereby forming landing plug contacts 8 for simultaneously exposing a plurality of gates 3 and surfaces formed between gates 3 and junction areas 5.

Figure 1F:
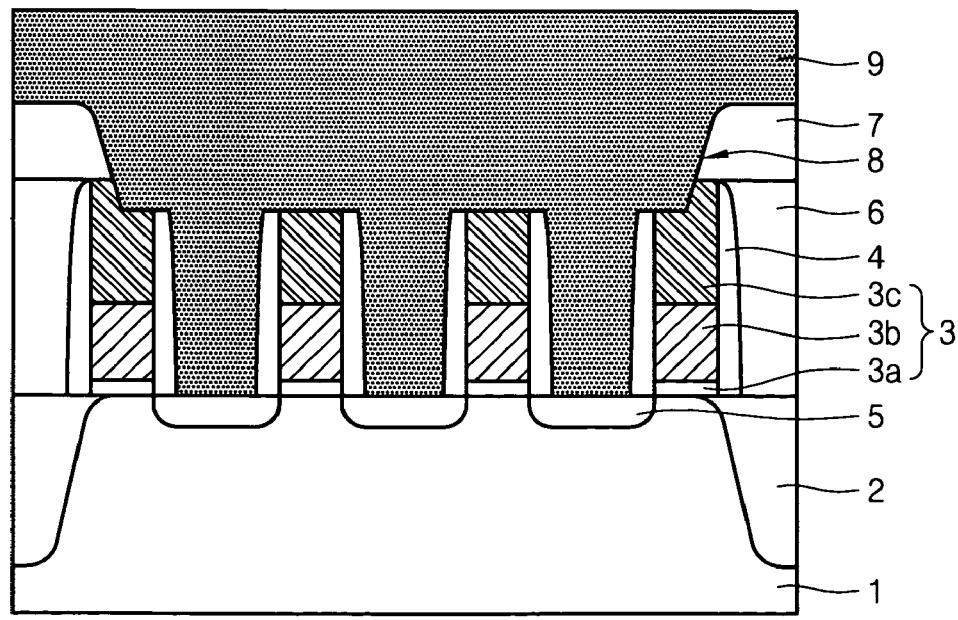

Referring to FIG. 1f, plug material, preferably, a polysilicon layer 9 is deposited on the resultant structure of the substrate with a thick thickness so as to fill the landing plug contacts 8.

Figure 1G:
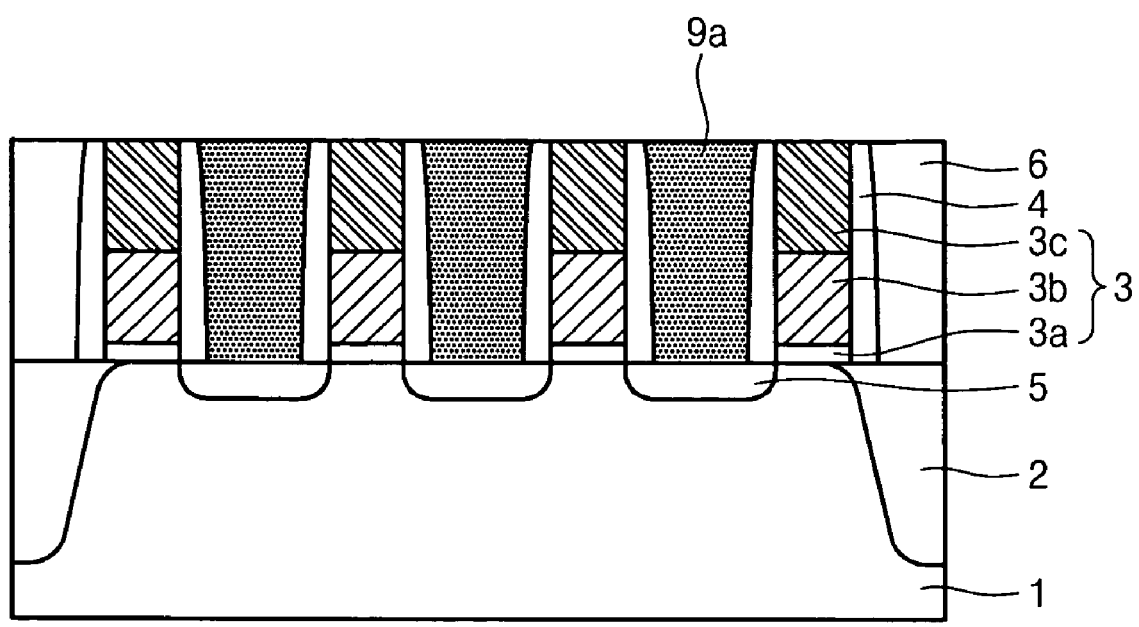

Referring to FIG. 1g, the polysilicon layer and the second BPSG layer are polished trough the CMP process until the nitride hard mask 3c is exposed, thereby forming landing plug polys 9a between gates 3. The landing plug polys 9a make contact with the gates 3 while being separated from the junction areas 5. At this time, the CMP process for the polysilicon layer and the second BPSG layer is performed by using slurry identical to slurry used in the CMP process for the first BPSG layer. That is, acid slurry including colloidal silica abrasive and having pH of about 2–7 is used for the CMP process. In addition, polycyclic acid-based material is added to such acid slurry in order to minimize loss of the nitride hard mask 3c.

Herein, since the CMP process is performed by using acid slurry having a high polishing selectivity between an oxide layer and a nitride layer, the dishing phenomenon may not be created in a surface of the polysilicon layer including plug material and a surface of the BPSG layer including insulating interlayer material. In detail, the dishing phenomenon is not created in surfaces of the landing plug polys 9a and remaining first BPSG layer 6, so an additional process for removing the dishing phenomenon is not necessary. Therefore, semiconductor manufacturing process is simplified and fault occurring in the dishing region caused by remaining polishing residual can be prevented.

After that, next processes including the bit line forming process are carried out with respect to the resultant structure, thereby fabricating the semiconductor device.

As described above, according to the method of manufacturing the semiconductor device of the present invention, the CMP process is carried out for the first BPSG layer including insulating interlayer material by using acid slurry having a high polishing selectivity with respect to the nitride layer. In addition, after the CMP process has been carried out, the second BPSG layer is deposited such that a step difference between the cell region and the peripheral region is removed, thereby simplifying the semiconductor manufacturing process.

In addition, according to the method of the present invention, when forming the landing plug polys, the CMP process is carried out for the polysilicon layer and the BPSG layer by using acid slurry, so the dishing phenomenon created in the polysilicon layer and the BPSG layer can be prevented or minimized, thereby improving a yield rate of the semiconductor devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising the steps of:
   i) forming gates having nitride hard mask on an upper surface of a semiconductor substrate;
   ii) forming junction areas on a surface of the semiconductor substrate between gates;
   iii) forming a first BPSG layer on a resultant structure of the semiconductor substrate such that the gates are covered with the first BPSG layer;
   iv) performing a first chemical mechanical polishing process with respect to the first BPSG layer by using acid slurry having a high polishing selectivity between an oxide layer and a nitride layer in such a manner that the nitride hard mask of each gate is exposed;
   v) forming a second BPSG layer on the first BPSG layer, which is polished through the chemical mechanical polishing process;
   vi) forming a landing plug contact, which simultaneously exposes surfaces of the junction areas formed between gates, by etching the second and first BPSG layers;
   vii) depositing a polysilicon layer on a resultant structure of the semiconductor substrate such that the landing plug contact is filled up with the polysilicon layer; and
   viii) performing a second chemical mechanical polishing process with respect to the polysilicon layer, the second BPSG layer and the nitride hard mask by using acid slurry in such a manner that landing plug polys make contact with gates while being spaced from the junction areas formed between the gates.

2. The method as claimed in claim 1, wherein step iii) includes the substeps of depositing a BPSG layer including 10 to 25 volume percent of boron and 5 to 12 volume percent of phosphorous with a thickness of about 3000 to 6000 Å, and annealing a resultant structure of the semiconductor substrate for 10 to 30 minutes in a steam atmosphere having a temperature of about 700 to 900° C. such that a gap-fill characteristic is maximized.

3. The method as claimed in claim 2, wherein a cleaning process is carried out after the annealing process by using sulfuric acid and hydrogen peroxide.

4. The method as claimed in claim 1, wherein acid slurry used in the first chemical mechanical polishing process for the first BPSG layer includes colloidal silica abrasive and has pH of about 2–7.

5. The method as claimed in claim 1, wherein polycyclic acid-based material is added to acid slurry in order to improve a polishing selectivity with respect to the nitride layer.

6. The method as claimed in claim 5, wherein polycyclic acid-based material includes polyacrylic acid or polyethylene glycol.

7. The method as claimed in claim 5, wherein 0.1 to 3 wt % of polycyclic acid-based material is added to acid slurry.

8. The method as claimed in claim 1, wherein step v) includes the substeps of depositing a BPSG layer including 2 to 10 volume percent of boron and 1 to 5 volume percent of phosphorous with a thickness of about 500 to 3000 Å, and annealing a resultant structure of the semiconductor substrate for 10 to 30 minutes in a steam atmosphere having a temperature below 750° C. such that a diffusion effect of boron ions is minimized against the resultant structure of the semiconductor substrate while significantly reducing a thermal budget as much as possible.

9. The method as claimed in claim 1, wherein acid slurry used in the second chemical mechanical polishing process for the polysilicon layer, second BPSG layer and nitride hard mask includes colloidal silica abrasive and has pH of about 2–7.

* * * * *